United States Patent [19]

Gotou

[11] Patent Number: 5,615,146
[45] Date of Patent: Mar. 25, 1997

[54] NONVOLATILE MEMORY WITH WRITE DATA LATCH

[75] Inventor: Hiroshi Gotou, Tokyo, Japan

[73] Assignee: NKK Corporation, Tokyo, Japan

[21] Appl. No.: 555,201

[22] Filed: Nov. 8, 1995

[30] Foreign Application Priority Data

Nov. 11, 1994 [JP] Japan .................. 6-278174

[51] Int. Cl.⁶ .................................. G11C 7/00
[52] U.S. Cl. ............ 365/185.01; 365/63; 365/185.13; 365/185.25; 365/189.05
[58] Field of Search ............ 365/185.01, 185.08, 365/185.13, 185.25, 185.29, 189.05, 63

[56] References Cited

U.S. PATENT DOCUMENTS

| | | | |
|---|---|---|---|
| 4,282,446 | 8/1981 | McElroy | 365/185 |
| 4,649,520 | 3/1987 | Eitan | 257/318 |
| 4,797,856 | 1/1989 | Lee et al. | 365/185 |
| 4,811,292 | 3/1989 | Watanabe | 365/185.23 |
| 4,931,997 | 6/1990 | Mitsuishi et al. | 365/218 |
| 4,953,123 | 8/1990 | Takeuchi et al. | 365/66 |
| 4,958,317 | 9/1990 | Terada et al. | 365/185.08 |
| 5,068,827 | 11/1991 | Yamada et al. | 365/218 |
| 5,126,808 | 6/1992 | Montalvo et al. | 365/238 |
| 5,132,935 | 7/1992 | Ashmore, Jr. | 365/218 |
| 5,179,536 | 1/1993 | Kasa et al. | 365/200 |
| 5,278,794 | 1/1994 | Tanaka et al. | 365/185.13 |
| 5,282,161 | 1/1994 | Villa | 257/314 |
| 5,283,758 | 2/1994 | Nakayama et al. | 365/185.26 |
| 5,307,312 | 4/1994 | Maurelli et al. | 257/314 |
| 5,327,385 | 7/1994 | Oyama | 365/218 |
| 5,402,373 | 3/1995 | Aritome et al. | 365/185 |
| 5,406,521 | 4/1995 | Hara | 365/185.29 |
| 5,491,656 | 2/1996 | Sawada | 365/185.29 |

FOREIGN PATENT DOCUMENTS

| | | |
|---|---|---|
| 0106681 | 4/1984 | European Pat. Off. . |
| 53-46621 | 12/1978 | Japan . |
| 62-266793 | 11/1987 | Japan . |
| 02-166764 | 6/1990 | Japan . |
| 04-105368 | 4/1992 | Japan . |
| 04-155694 | 5/1992 | Japan . |
| 05-189988 | 7/1993 | Japan . |

OTHER PUBLICATIONS

U.S. application Ser. No. 08/381,944 dated Dec. 1994, Gotou et al.

U.S. application Ser. No. 08/379,480 dated Jan. 1995, Gotou et al.

Patient Abstracts of Japan, vol. 16, No. 445 (P-1422), Sep. 17, 1992 & JP-A-04 155694 (Fujitsu Ltd), May 28, 1992.

International Electron Devices Meeting, Dec.8, 1980, Washington, US, pp. 602–606, Kupec et al., "Triple level polysilicon E2PROM with Single transistor per bit".

M. Lanzoni et al., "A Novel Approach to Controlled Programming of Tunnel-Based Floating-Gate MOSFET's," *IEEE Journal of Solid–State Circuits*, vol. 29, No. 2, Feb. 1994, pp. 147–150.

Hiroshi Gotou, "New Operation Mode for Stacked-Gate Flash Memory Cell," *IEEE Electron Devices Letters*, vol. 16, No. 3, Mar. 1995, pp. 121–123.

*Primary Examiner*—David C. Nelms
*Assistant Examiner*—Son T. Dinh
*Attorney, Agent, or Firm*—Nixon & Vanderhye, P.C.

[57] ABSTRACT

The drain of a memory cell transistor is connected to a sub bit line of an EEPROM. The sub bit line is connected to a latch circuit through a connection transistor. The potential of the sub bit line which corresponds to the data stored in the memory cell transistor is latched by the latch circuit. With this potential latching operation, the potential of the sub bit line is held at a predetermined value corresponding to the data stored in the memory cell.

15 Claims, 10 Drawing Sheets

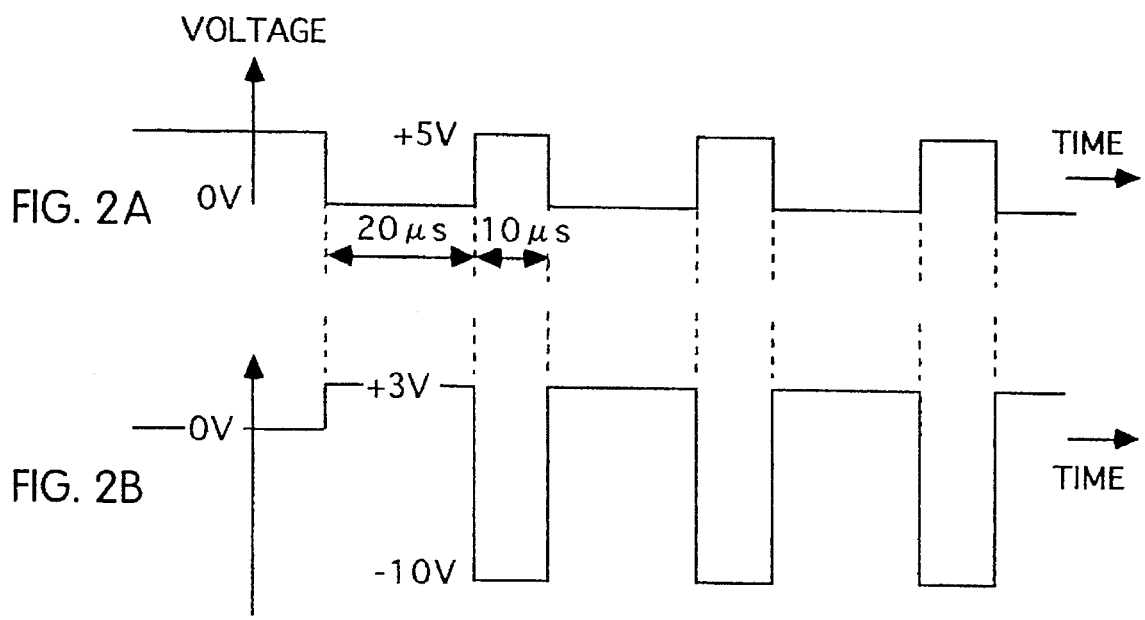
FIG. 2A
FIG. 2B
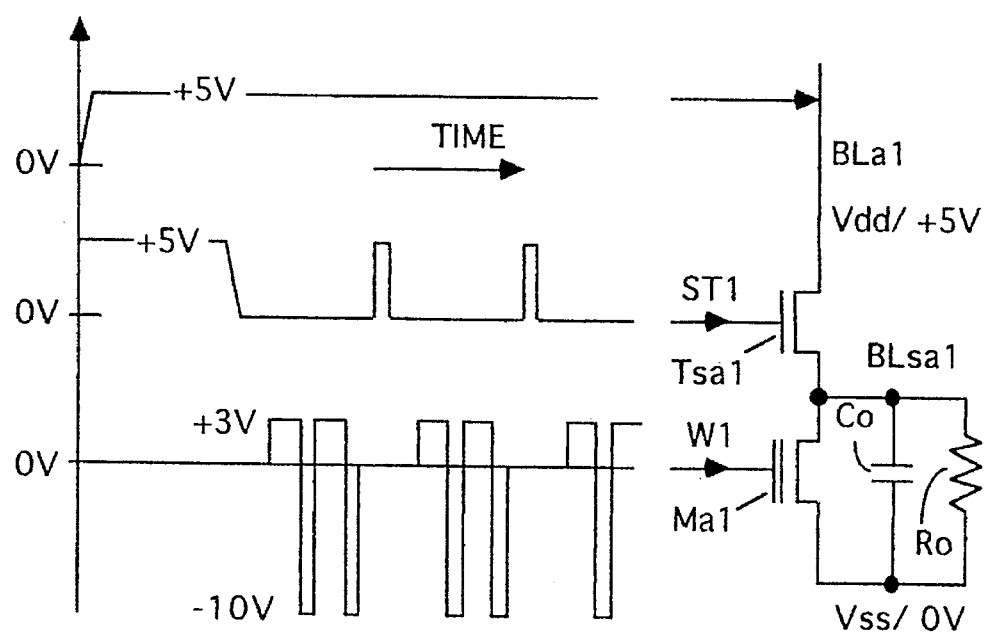
FIG. 3A                FIG. 3B

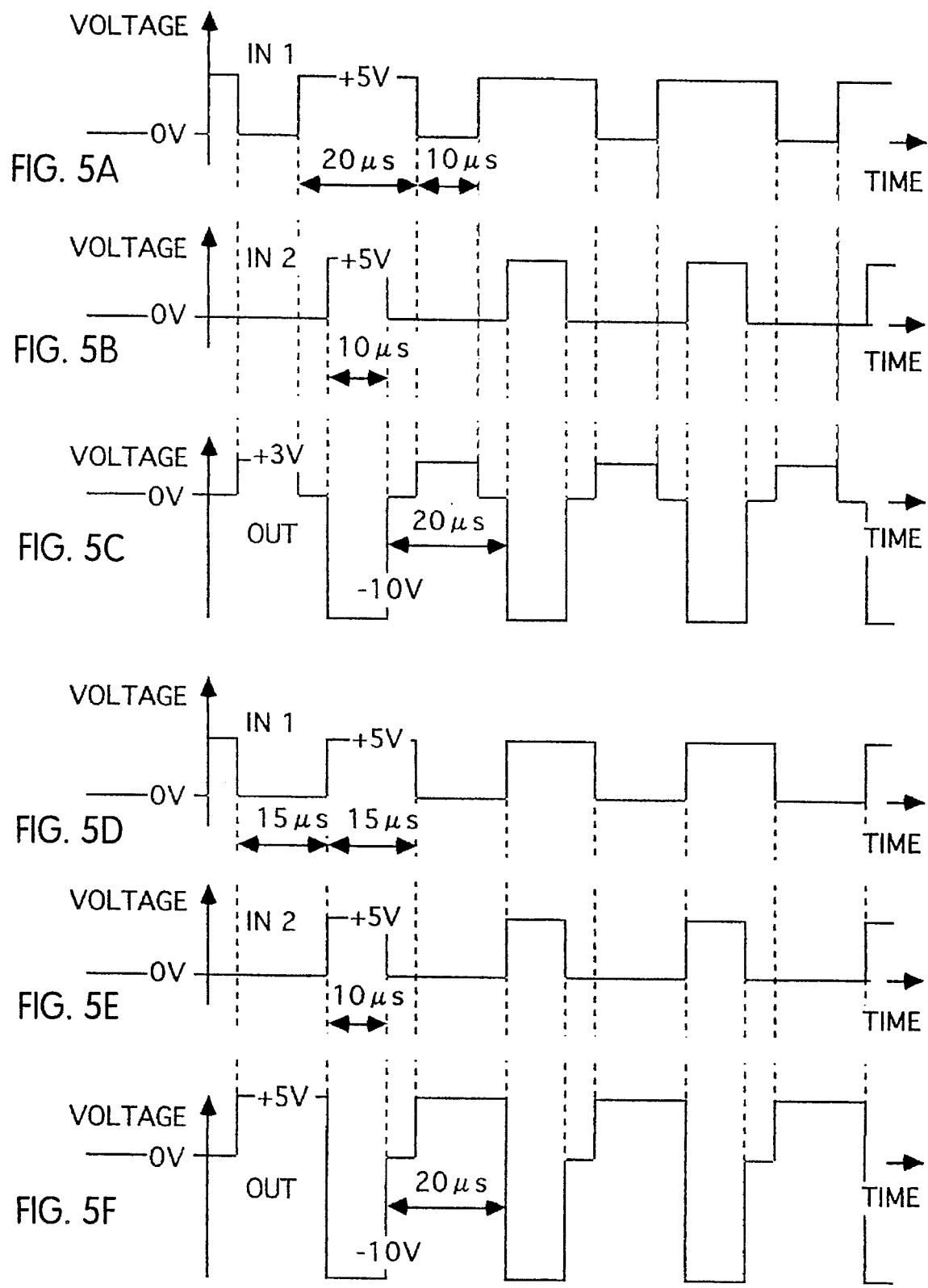

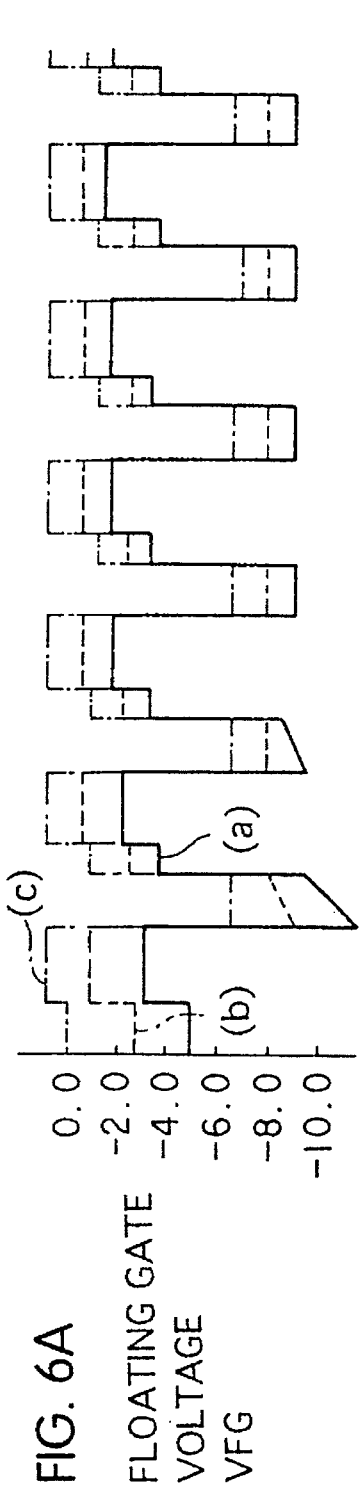
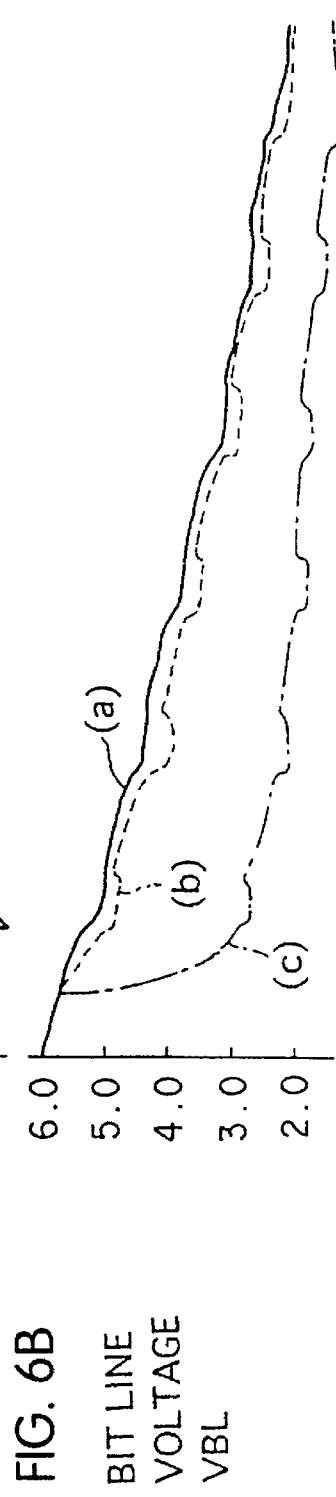
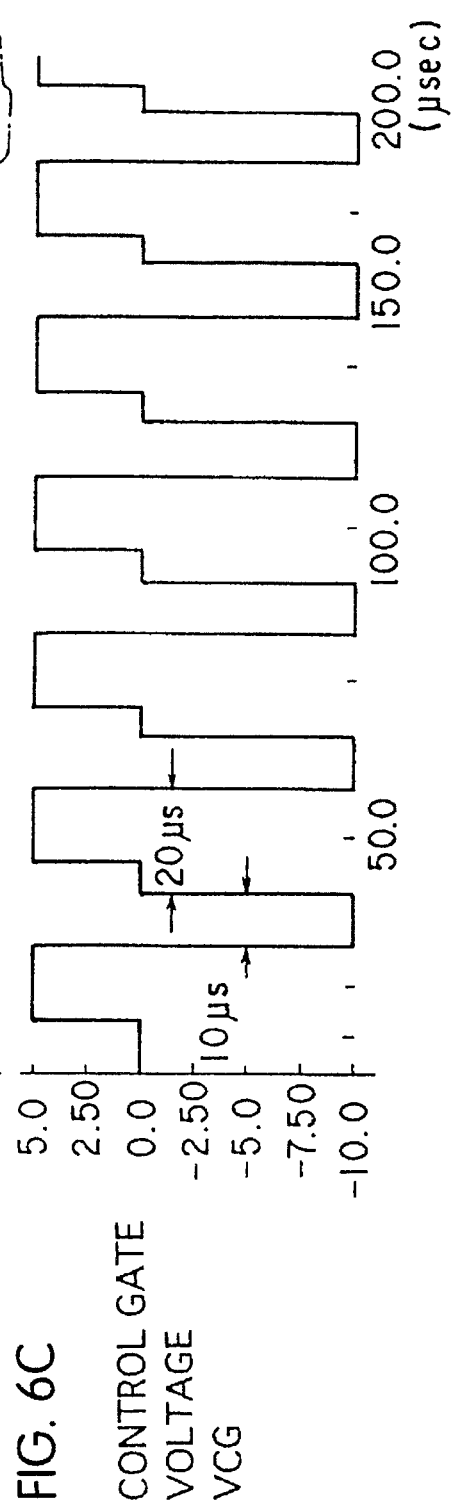
FIG. 6A FLOATING GATE VOLTAGE VFG
FIG. 6B BIT LINE VOLTAGE VBL
FIG. 6C CONTROL GATE VOLTAGE VCG

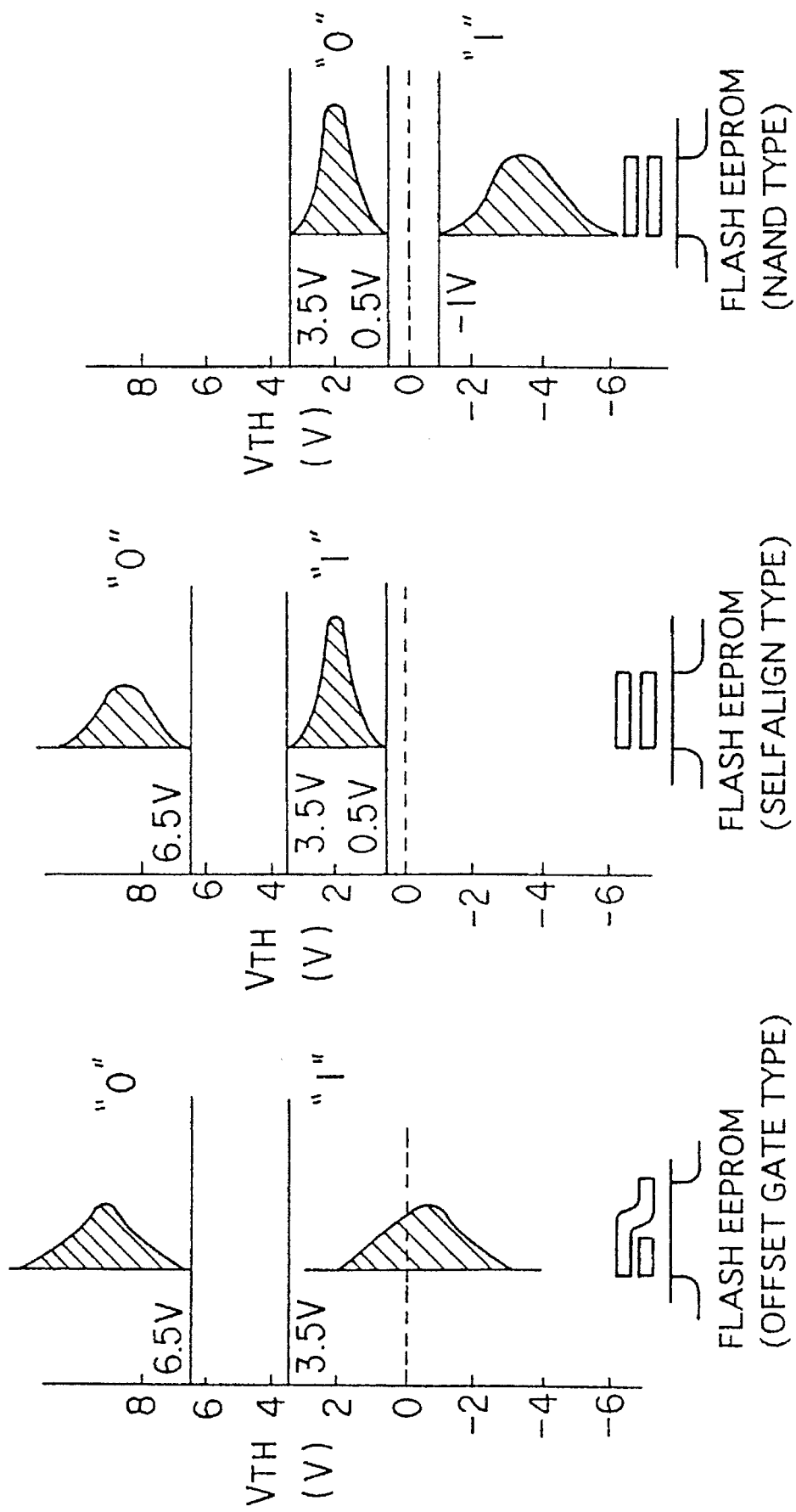

NONVOLATILE MEMORY WITH WRITE DATA LATCH

BACKGROUND OF THE INVENTION

1. Field of the Invention

The present invention relates to a nonvolatile semiconductor memory (EEPROM) capable of electrically rewriting/erasing information.

2. Description of the Related Art

The stored information rewrite operations of nonvolatile semiconductor memories are roughly classified into operations performed by a scheme (1) of writing information with hot electrons and erasing information with a tunnel current and operations performed by a scheme (2) of writing information with a tunnel current and erasing information with a tunnel current.

A flash EEPROM is a typical example of the nonvolatile semiconductor memory using the former scheme (1). In the flash EEPROM, information is written by applying a write voltage (high voltage Vpp) to both the control gate and drain electrode of a MOS transistor constituting a memory cell and injecting hot electrons into the floating gate.

In such an EEPROM, the threshold of a memory cell transistor changes with a change in the channel length of a MOS transistor for a memory cell, the thickness of the tunnel current passage insulating film (the thickness of the tunnel oxide film) under the floating gate, the electrode voltage between the source and the drain, or the like. As a result, the distribution (data "0") of threshold voltage VTH after information is written in each memory cell transistor greatly varies, as indicated by the hatched upper distribution in FIG. 7A or 7B.

In an erase operation, the control gate of a MOS transistor for a memory cell is grounded, and an erase voltage (Vpp) is applied to the source electrode (or the drain electrode), thereby extracting the electrons trapped in the floating gate to the source electrode (or the drain electrode) in the form of a tunnel current. In this erase operation as well, the distribution (data "1") of threshold voltage VTH of the memory cell after the information is erased is dependent on variations in the voltage (word line voltage) of the control gate, the drain voltage (or the bit line voltage), the thickness of the tunnel oxide film, or the like, and hence greatly varies, as indicated by the hatched lower distribution in FIG. 7A or 7B.

A NAND type EEPROM is a typical example of the nonvolatile semiconductor memory using the latter scheme (2). In the NAND type EEPROM, information is written or erased with a tunnel current from the floating gate of a MOS transistor constituting a memory cell.

The tunnel current used in the scheme (2) varies depending on variations in word line voltage (control gate voltage), bit line voltage (drain voltage), or the thickness of a tunnel oxide film, as in the erase operation performed by the scheme (1) described above. For this reason, in the scheme (2) as well, the distribution of threshold voltage VTH of a memory cell transistor in a write/erase operation greatly varies, as indicated by the hatched upper/lower distribution in FIG. 7C.

For example, in the case shown in FIG. 7B, of the variations in threshold voltage VTH, since variations on the upper voltage side (data "0" write operation) are distributed on the side higher than the read voltage (+5 V of TTL level) of the EEPROM, no significant problem is posed. However, since variations in threshold voltage VTH on the lower voltage side (data "1" erase operation) are distributed on the side lower than the read voltage (+5 V of TTL level) of the EEPROM, a data read operation is greatly influenced by the variations.

More specifically, if threshold voltage VTH (in particular, a threshold set after the electrons in the floating gate are extracted in an erase operation) of a memory cell transistor constituting the EEPROM greatly varies as described above, it is possible not to perform an information read operation based on a predetermined threshold voltage.

As a device which suppresses the above variations in threshold, a nonvolatile semiconductor memory disclosed in Japanese Patent Application (Heisei) No. 6-222734 filed by the same applicant as that of the present application on Aug. 25, 1994 is available. This Japanese patent application corresponds to U.S. patent application Ser. No. 08/516,830 filed on Aug. 18, 1995. According to the invention of this preceding application, variations in threshold of many memory cell transistors can be greatly suppressed.

According to the invention of this preceding application, after electrons are extracted from the floating gates of a memory cell transistor, the bit line potential varies. This variation in potential may influence the subsequent circuit operation somehow (decreasing the set potential precision in a sub bit line precharge operation).

SUMMARY OF THE INVENTION

The present invention has been made in consideration of the above situation, and has as its object to provide a nonvolatile semiconductor memory which suppresses variations in bit line potential (sub bit line potential) when data is written in a memory cell transistor.

In order to achieve the above object, the nonvolatile semiconductor memory of the present invention includes a latch circuit (flip-flop circuit) connected to a bit line (sub bit line) for transferring write information to a memory cell transistor to hold the potential of the bit line.

In the nonvolatile semiconductor memory according to the present invention, one potential (e.g., +3 V) of the word line drive signal (WDP) is applied to the control gate of a target memory cell transistor (Ma1), and it is then checked whether the memory cell transistor is turned on by one potential (+3 V).

If the target memory cell transistor is turned on, the bit line potential drops through the drain-source path of the transistor. Thereafter, even if the other potential (e.g., −10 V) of the word line drive signal (WDP) is applied to the control gate of the memory cell transistor, no charges are removed from the floating gate of the transistor in the form of a tunnel current (prevention of an over-erased state).

If the memory cell transistor is not turned on (the threshold of the target memory cell transistor is higher than a desired value) by one potential (+3 V) of the initial word line drive signal (WDP), no drop in bit line potential occurs. When the other potential (−10 V) of the word line drive signal (WDP) is applied to the control gate immediately after the above operation, a small amount of stored charge is extracted from the floating gate of the target memory cell transistor in the form of a tunnel current. As a result, the threshold of the target memory cell transistor drops by the amount corresponding to the extracted charges.

When the memory cell transistor is not turned on (the threshold of the target memory cell transistor is higher than the desired value) even after one potential (+3 V) of the word line drive signal (WDP) is applied to the memory cell transistor whose threshold has dropped to some degree, no drop in bit line potential occurs. When the other potential (−10 V) of the word line drive signal (WDP) is applied to the control gate immediate after the above operation, stored charges are extracted from the floating gate of the target memory cell transistor again in the form of a tunnel current. As a result, the threshold of the target memory cell transistor further drops by the amount corresponding to the extracted charges.

If the memory cell transistor is turned on (i.e., the threshold of the target memory cell transistor drops to the desired value) after one potential (+3 V) of the word line drive signal (WDP) is applied to the memory cell transistor whose threshold has dropped further, the bit potential drops through the drain-source path of the target memory cell transistor in an ON state. Thereafter, even if the other potential (−10 V) of the word line drive signal (WDP) is applied to the control gate of the memory cell transistor, no charges are removed from the flowing gate in the form of a tunnel current (prevention of an over-erased state). At this time, the target memory cell transistor has undergone an erase operation to be accurately set to a desired threshold without causing an over-erased state.

In this case, in the absence of the latch circuit in the present invention, the bit line (sub bit line) potential slightly varies owing to the ON/OFF operation of the target memory cell transistor which is synchronized with a change in the level of the word line drive signal.

In contrast to this, in the presence of the latch circuit in the present invention, since the bit line (sub bit line) potential set after the threshold of the target memory cell transistor is set to the desired value is latched by the latch circuit, this bit line (sub bit line) potential is fixed to the latched potential. No variation in potential therefore occurs.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are timing charts for explaining the circuit operation of a word line drive pulse generator (level shifter) used in the memory in FIG. 1, in which FIG. 2A shows the waveform of an input signal, and FIG. 2B shows the waveform of an output pulse;

FIGS. 3A and 3B are views for explaining the circuit operations of a bit line selection transistor and a memory cell transistor in the memory in FIG. 1, in which FIG. 3A is a timing chart showing the waveforms of voltages used in the main part of the circuit, and FIG. 3B is an equivalent circuit diagram based on a capacitance component on a bit line and a leakage current component;

FIGS. 5A to 5F are timing charts for explaining the circuit operation of a word line drive pulse generator (level shifter) used in the memory in FIG. 4, in which FIG. 5A shows the first input signal waveform in the first example, FIG. 5B shows the second input signal waveform in the first example, FIG. 5C shows an output pulse waveform in the first example, FIG. 5D shows the first input signal waveform in the second example, FIG. 5E shows the second input signal waveform in the second example, and FIG. 5F shows an output pulse waveform in the second example;

FIGS. 6A to 6C are timing charts for explaining the operation of each memory cell constituting the nonvolatile semiconductor memory in FIG. 4 in a case wherein the word line drive pulse generator (level shifter) in FIG. 4 is operated with the waveforms in FIGS. 5D to 5F, in which FIG. 6A shows the waveform of a voltage applied to the floating gate of a MOS transistor constituting each memory cell, FIG. 6B shows a change in the voltage of the bit line to which the MOS transistor is connected, and FIG. 6C shows the waveform of a voltage applied to the control gate of the MOS transistor;

FIGS. 7A to 7C are graphs for explaining conventional EEPROM cell structures and the threshold distributions of the cells, in which FIG. 7A shows the threshold distribution of an offset gate type flash EEPROM, FIG. 7B shows the threshold distribution of a selfalign type flash EEPROM, and FIG. 7C shows the threshold distribution of a NAND type EEPROM;

FIGS. 10A to 10C are views for explaining a nonvolatile semiconductor memory according to the fifth embodiment of the present invention, in which FIG. 10A is a circuit diagram showing the arrangement of the main part of the memory, FIG. 10B is a timing chart showing the waveforms of signals used in the main part, and FIG. 10C is a circuit diagram showing a portion of the main part;

DETAILED DESCRIPTION OF THE PREFERRED EMBODIMENTS

The arrangement and operation of a nonvolatile semiconductor memory (EEPROM) of the present invention will be described below with reference to the accompanying drawings. (An arrangement corresponding to the embodiments shown in FIGS. 1 to 9 is also disclosed in U.S. patent application Ser. No. 08/516,830 filed by the same applicant as that of the present application on Aug. 18, 1995. The present invention is embodied by combinations of these embodiments and the circuit arrangements in FIGS. 10A to 12.)

Figure 1:
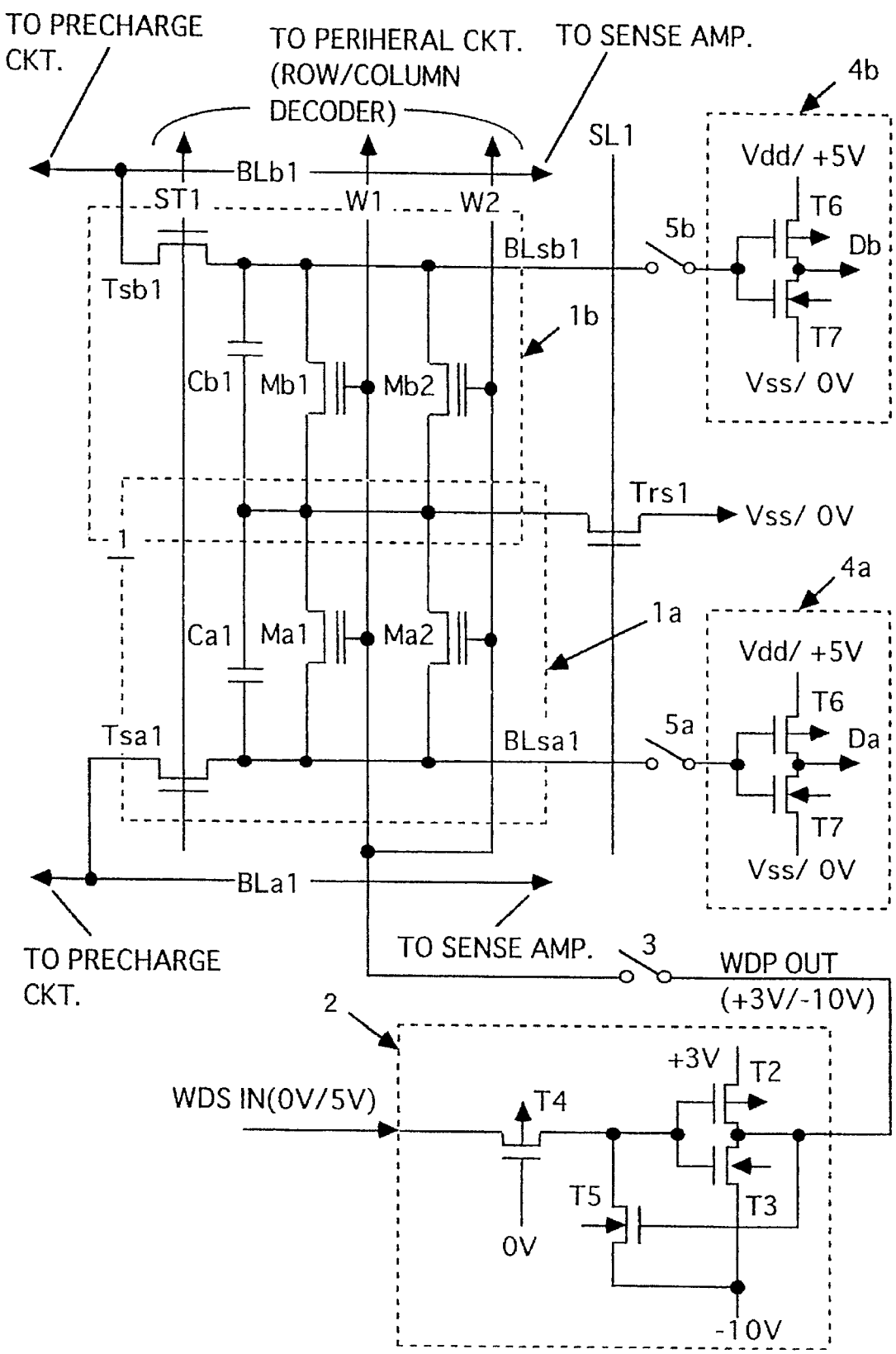
FIG. 1 is a circuit diagram for explaining the arrangement of a nonvolatile semiconductor memory according to an embodiment of the present invention.

FIG. 1 is a circuit diagram showing the main part of an EEPROM according to an embodiment of the present invention. Referring to FIG. 1, memory cell array 1 includes bit line selection transistor Tsa1 for selectively connecting main bit line BLa1 to sub bit line BLsa1, nonvolatile memory cell transistors Ma1 and Ma2 whose drains are connected to sub bit line BLsa1, and bit line capacitor Ca1 connected between sub bit line BLsa1 and a common source circuit for nonvolatile memory cell transistors Ma1 and Ma2. Each of non-volatile memory cell transistors Ma1 and Ma2 has an n-channel MOS transistor structure having a control gate and a floating gate. Nonvolatile charge information is held in the floating gate of each nonvolatile memory cell transistor.

In this case, a sub bit line is a conductive line connected to the drain (or source) of a memory cell transistor, and a main bit line is a conductive line connected to a sub bit line via a switch means.

Memory cell array 1 further includes bit line selection transistor Tsb1 for selectively connecting main bit line BLb1 to sub bit line BLsb1, nonvolatile memory cell transistors Mb1 and Mb2 whose drains are connected to sub bit line BLsb1, and bit line capacitor Cb1 connected between sub bit line BLsb1 and a common source circuit for nonvolatile memory cell transistors Mb1 and Mb2. Each of nonvolatile memory cell transistors Mb1 and Mb2 has a control gate and a floating gate. Nonvolatile charge information is held in the floating gate of each nonvolatile memory cell transistor.

The common source circuits for memory cell transistors Ma1, Ma2, Mb1, and Mb2 are selectively connected to a ground circuit (or a negative power supply vss/0 V circuit) via source-side selection transistor Trs1.

Bit line selection gate line ST1 is connected to the gates of bit line selection transistors Tsa1 and Tsb1, and source-side selection gate line SL1 is connected to the gate of source-side selection transistor Trs1. Word line W1 is connected to the gates of memory cell transistors Ma1 and Mb1, and word line W2 is connected to the gates of memory cell transistors Ma2 and Mb2.

The arrangement of each of the memory cell transistors (Ma1 to Ma2/Mb1 to Mb2) will be described in detail.

The floating gate has a size of 3 µm×1 µm and is in contact with portions of the channel and the source/drain through the gate oxide film.

The channel has a size of 1 µm×1 µm. The gate oxide film has a thickness of 10 nm.

The insulating film between the floating gate and the control gate is constituted by an ONO film (silicon oxide film/silicon nitride film/silicon oxide film) having a thickness of 15 nm figured out as the thickness of the silicon oxide film.

Bit line selection transistor Tsa1, memory cell transistors Ma1 and Ma2, and bit line capacitor Ca1 constitute memory cell block 1a. Bit line selection transistor Tsb1, memory cell transistors Mb1 and Mb2, and bit line capacitor Cb1 constitute memory cell block 1b.

Referring to FIG. 1, for the sake of easy understanding, each memory cell block includes two memory cell transistors (Ma1 and Ma2 or Mb1 and Mb2). In practice, however, the number of memory cell transistors constituting each memory cell block can be increased (e.g., 256 to 1024 memory cell transistors per block). In this case, the number of word lines (W1 and W2) increases in accordance with the actual number of memory cell transistors.

Memory cell block 1a has a DRAM function using a synthetic capacitance (bit line equivalent capacitance Co: about 100 fF to 300 fF) consisting of the capacitance of bit line capacitor Ca1 and the stray capacitance (parasitic capacitance) of sub bit line BLsa1 as an information storage means. That is, information can be stored in capacitance Co of sub bit line BLsa1 according to the same operation principle of the DRAM by charging the bit line equivalent capacitance Co with the voltage of main bit line BLa1 when bit line selection transistor Tsa1 is turned on, and periodically refreshing the voltage of charged capacitance Co.

Memory cell block 1b has a DRAM function using a synthetic capacitance (bit line equivalent capacitance Co of about 100 fF to 300 fF) of the capacitance of bit line capacitor Cb1 and the stray capacitance of sub bit line BLsb1 as an information storage means. That is, information can be stored in capacitance Co of sub bit line BLsb1 according to the same operation principle of the DRAM by charging the bit line equivalent capacitance Co with the voltage of main bit line BLb1 when bit line selection transistor Tsb1 is turned on, and periodically refreshing the voltage of charged capacitance Co.

When the arrangement shown in FIG. 1 is regarded as a DRAM using bit line equivalent capacitance Co of sub bit line BLsa1 (BLsb1) as a memory cell capacitor as described above, main bit line BLa1 (BLb1) corresponds to a bit line of the DRAM, and bit line selection gate line ST1 corresponds to a word line of the DRAM.

The above DRAM structure of main bit line BLa1 serves as a write buffer which operates at a high speed relative to memory cell block 1a serving as an EEPROM. The above DRAM structure of main bit line BLb1 serves as a write buffer which operates at a high speed relative to memory cell block 1b serving as an EEPROM.

As memory elements decrease in size with advances in semiconductor manufacturing techniques, the value of the stray capacitance (the value of the parasitic capacitance between the sub bit line and the semiconductor region in which the sub bits line is formed) of sub bit line BLsa1/BLsb1 tends to decrease. If 100 to 300 fF or more can be ensured as the sum of such stray capacitances and the capacitances between the drains and sources of many memory cell transistors (Ma1 and Ma2/Mb1 and Mb2), capacitors Ca1 and Cb1 can be omitted.

FIG. 1 shows part of the arrangement of the EEPROM. An actual memory cell array includes many main/sub bit lines, word lines, selection gate lines, selection transistors, memory cell transistors, and the like. These memory cell transistors are arranged in the form of a matrix. Row and column decoder circuits (peripheral circuits) for specifying a predetermined memory cell in accordance with an external address input are connected to this memory cell matrix. A bit line precharge circuit and a sense amplifier for reading stored data from a specified memory cell transistor are connected to each of a plurality of main bit lines. The arrangements of these row and column decoder circuits, precharge circuits, and sense amplifiers in a general DRAM are known.

Sub bit line BLsa1 is connected to charge extraction completion detector 4a via switch circuit 5a, and sub bit line BLsb1 is connected to charge extraction completion detector 4b via switch circuit 5b. Each of charge extraction completion detectors 4a and 4b is constituted by a CMOS inverter having p-channel MOS transistor T6 on the positive power supply Vdd (e.g., +5 V) side, and n-channel MOS transistor T7 on the negative power supply Vss (0 V).

Charge extraction completion detector 4a generates output Da of Vss level (=0 V) if the potential of sub bit line BLsa1 is higher than the gate threshold (e.g., +2.5 V) of n-channel MOS transistor T7 when switch circuit 5a is closed, and generates output Da of the Vdd level (=5 V) if the potential of sub bit line BLsa1 is lower than the gate threshold (e.g., 5 V−2.5 V=+2.5 V) of p-channel MOS transistor T6 when switch circuit 5a is closed.

In other words, when output Da from charge extraction completion detector 4a is at Vss level (=0 V), extraction of the charges from the floating gate of target memory cell transistor Ma1 (or Ma2) connected to sub bit line BLsa1 is not completed. When output Da changes to the Vdd level (=5 V), the completion of extraction of the charges from the floating gate of target memory cell transistor Ma1 (or Ma2) connected to sub bit line BLsa1 is detected.

Similarly, when output Db from charge extraction completion detector 4b is at the Vss level (=0 V), extraction of the charges from the floating gate of target memory cell transistor Mb1 (or Mb2) connected to sub bit line BLsb1 is not completed. When output Db changes to the Vdd level (=5 V), the completion of extraction of the charges from the floating gate of target memory cell transistor Mb1 (or Mb2) connected to sub bit line BLsb1 is detected.

Word lines W1 and W2 are commonly connected to the output circuit of word line drive pulse generator 2 via word line switch circuit 3. Word line drive pulse generator 2 comprises a CMOS inverter (p-channel transistor T2 +n-channel transistor T3) connected to a positive power supply of +3 V and a negative power supply of −10 V, a normally ON p-channel transistor T4 (which becomes a selection transistor if its gate potential is controlled) on the input side, and n-channel transistor T5 for positively feeding back an output from the CMOS inverter to the input side.

Word line drive pulse generator 2 generates pulse output WDPOUT whose potential changes between, for example, +3 V and −10 V in accordance with the signal potential of input WDSIN whose potential changes between, for example, 0 V and +5 V.

Upon reception of word line drive signal input WDSIN having the waveform shown in FIG. 2A, word line drive pulse generator 2 generates word line drive pulse output WDPOUT having the waveform shown in FIG. 2B. Circuit 2 has a level shifting function of changing a pulse of 0 V/+5 V like the one shown in FIG. 2A to a pulse of +3 V/−10 V like the one shown in FIG. 2B.

When word line switch circuit 3 is turned on, word line drive pulse output WDPOUT of +3 V/−10 V like the one shown in FIG. 2B is supplied to word lines W1 and W2. With this operation, all the memory cell transistors whose control gates are connected to word lines W1 and W2 (i.e., the memory cell transistors each having a drain to which a sufficient sub bit line potential is applied) can be set to a predetermined threshold to perform a batch erase operation by word line drive pulse output WDPOUT of +3 V/−10 V (a batch erase flash EEPROM operation to be performed for all the bits or a memory block at a time).

The circuit operations (erase/leakage current compensation) of bit line selection transistor Tsa1 and memory cell transistor Ma1 of the EEPROM shown in FIG. 1 will be described with reference to FIGS. 3A and 3B. FIG. 3B shows a simplified circuit of the memory arrangement shown in FIG. 1. FIG. 3A shows the waveform of a voltage applied to each component.

Referring to FIG. 3B, main bit line BLa1 is connected to the drain of n-channel MOS memory cell transistor Ma1 via the drain-source path of bit line selection transistor Tsa1, and bit line equivalent capacitance Co and leakage current component equivalent resistance Ro are connected in parallel between the drain and source of transistor Ma1.

In this case, bit line equivalent capacitance Co exhibits the synthetic value of the stray capacitance of sub bit line BLsa1 and the capacitance of bit line capacitor Ca1, and leakage current component equivalent resistance Ro exhibits the value of a path through which a current leaks from sub bit line BLsa1 into the source circuit (Vss/0 V) of memory cell transistor Ma1. Assume that bit line equivalent capacitance Co is about 1 pF, and leakage current component equivalent resistance Ro is about 1,000 MΩ.

An erase operation (see FIG. 7B) will be described, provided that threshold voltage VTH of nonvolatile memory cell transistor Ma1 is 6.5 V or more at first.

When a potential of +5 V like the one shown at the upper portion in FIG. 3A is applied to main bit line BLa1 while a potential of +5 V like the one shown at the intermediate left portion in FIG. 3A is applied to bit line selection gate line ST1, transistor Tsa1 is turned on, and sub bit line BLsa1 is precharged to almost +5 V (a reference potential, 0 V=Vss, is set in the source circuit of memory cell transistor Ma1).

When the potential of bit line selection gate line ST1 is lowered to 0 V after the above operation as indicated by the intermediate left portion near the center in FIG. 3A, transistor Tsa1 is turned off, and sub bit line BLsa1 is electrically disconnected from main bit line BLa1 to be set in a floating state. In this state, the precharge potential of +5 V of sub bit line BLsa1 is maintained by the charges stored in bit line equivalent capacitance Co as a small capacitance (1 pF).

Subsequently, a word line drive pulse like the one shown at the lower left portion near the center in FIG. 3A is applied to the control gate of memory cell transistor Ma1 via word line W1. As this pulse, output WDPOUT from word line drive pulse generator 2 in FIG. 1 is used. In this case, the interval (0 V interval) during which the word line drive pulse shown at the lower portion in FIG. 3A is not generated is the interval during which word line switch circuit 3 in FIG. 1 is kept off. In the interval during which this pulse is generated, word line switch circuit 3 is kept on.

When word line switch circuit 3 is turned on, a voltage of +3 V is applied to the control gate of memory cell transistor Ma1 for a short period of time (e.g., 20 µs). However, since threshold voltage VTH is assumed to be 6.5 V or more at first, transistor Ma1 is kept off. At this point, if a drop in sub bit line potential due to a leakage current flowing via leakage current component equivalent resistance Ro can be still regarded as a negligible state, the floating state (+5 V) of sub bit line BLsa1 can be maintained.

When a word line drive pulse of −10 V is applied to the control gate of memory cell transistor Ma1 for a short period of time (e.g., 10 µs), a tunnel current flows between the floating gate and drain of memory cell transistor Ma1 whose drain is precharged to +5 V. With this tunnel current, some of the charges in the floating gate are extracted. As a result, threshold voltage VTH of memory cell transistor Ma1 drops to some degree.

Even if threshold VTH of memory cell transistor Ma1 drops to some degree, memory cell transistor Ma1 is not turned on as long as threshold voltage VTH is higher than +3 V equal to the voltage of the word line drive pulse.

Even in the interval during which memory cell transistor Ma1 is kept off, if a sufficient precharge potential is applied to the drain, charges are extracted from the floating gate little by little in the form of a tunnel current every time a word line drive pulse of −10 V is applied. As a result, threshold voltage VTH gradually drops.

The charge voltage (sub bit line precharge potential) of bit line equivalent capacitance Co drops with time owing to a tunnel current flowing in the floating gate of memory cell transistor Ma1 and a leakage current flowing in leakage current component equivalent resistance Ro. If this precharge potential excessively drops (i.e., the drain voltage of memory cell transistor Ma1 excessively drops), no tunnel current flows in the floating gate even if a voltage of −10 V is applied thereto. In such a case, a gradual drop in threshold voltage VTH of transistor Ma1 stops before the voltage reaches a desired value (e.g., +2.5 V) corresponding to +3 V of the word line drive pulse.

In order to prevent a drop in the sub bit line precharge potential, according to the arrangement shown in FIGS. 3A and 3B, bit line selection transistor Tsa1 is intermittently and instantaneously turned on in the interval during which word line drive pulse output WDPOUT is applied to word line W1, thereby injecting a small amount of charge from main bit line BLa1 into sub bit line BLsa1 in a floating state.

More specifically, word line switch circuit 3 in FIG. 1 is turned off in accordance with the timing at which the potential of sub bit line BLsa1 in the floating state drops to some degree, and the application of word line drive pulse output WDPOUT to word line W1 is interrupted (for a period equal to or shorter than one period, 30 μs, of pulse WDPOUT, e.g., 7 μs), as indicated by the lower central portion in FIG. 3A. Thereafter, as indicated by the intermediate central portion in FIG. 3A, a short pulse of 5 V (e.g., a pulse of a width 3 μs with an OFF interval of 2 μs between the adjacent pulses) is applied to bit line selection transistor Tsa1 to instantaneously turn it on in the interval (7 μs) during which word line drive pulse output WDPOUT is not generated, thereby restoring sub bit line BLsa1, whose potential has dropped, to the precharge state corresponding to +5 V.

With a combination of the pulses indicated by the intermediate and lower portions in FIG. 3A described above, the potential (about +5 V) of sub bit line BLsa1 in a floating state is ensured even if a bit line leakage current flows. With this operation, by repeatedly applying word line drive pulse output WDPOUT of −10 V, charges are extracted from memory cell transistor Ma1 in the floating gate little by little.

When threshold voltage VTH of memory cell transistor Ma1s drops to a desired value (+2.5 V) as a result of the extraction of the charges, memory cell transistor Ma1 is turned on by word line drive pulse output WDPOUT of +3 V, and the potential of sub bit line BLsa1 drops to 0 V. Subsequently, the extraction of charges from the floating gate of memory cell transistor Ma1 is stopped, and threshold voltage VTH of memory cell transistor Ma1 is accurately set to a desired value, i.e., +2.5 V (corresponding to the erased state of memory cell transistor Ma1).

The completion of the erase operation of memory cell transistor Ma1 is detected (Da="1") by charge extraction completion detector 4a shown in FIG. 1 and connected to sub bit line BLsa1. After the completion of the erase operation is detected, the application of the pulse having a width of 3 μs and indicated by the intermediate central portion in FIG. 3A is also stopped.

If the above erase operation is simultaneously performed with respect to all the memory cell transistors (Ma1 and Ma2) of memory cell block 1a, a batch erase operation (flash erase operation) in units of blocks can be realized. If this erase operation is simultaneously performed with respect to all the memory cell blocks, a batch erase operation in units of memory chips can be realized. If this erase operation is sequentially performed for each memory cell transistor, an erase operation in units of bits can be realized.

In any of the erase operations, the potential of a sub bit line is kept at a predetermined value (about +5 V), and extraction of charges from the floating gate of each memory cell transistor is sequentially performed while the sub bit line potential is sequentially compared with a predetermined word line potential (+3 V). Therefore, threshold voltages VTH of all the memory cell transistors can be caused to accurately converge to a desired value (+2.5 V).

In addition, since this converging operation can be completed by 10 pulses of word line drive pulse output WDPOUT (a maximum of about 300 μs using pulses each corresponding to 30 μs), a flash erase operation in units of blocks or memory chips can be performed at a high speed (within 300 μs).

A mechanism for preventing an over-erased state when threshold voltage VTH of memory cell transistor Ma1 is lower (e.g., +2 V) than the desired value will be described next.

First of all, similar to the case wherein threshold voltage VTH is higher than the desired value, potential Vss of the source line of memory cell transistor Ma1 is set to the ground potential, i.e., 0 V, and bit line selection transistor Tsa1 is turned on to precharge the potential of sub bit line BLsa1 to +5 V. Thereafter, bit line selection transistor Tsa1 is turned off to set sub bit line BLsa1 in a floating state corresponding to +5 V. In this case, bit line equivalent capacitance Co is in a charged state.

Subsequently, a word line drive pulse like the one indicated by the lower portion in FIG. 3A is applied to word line W1. Since the drain of memory cell transistor Ma1, whose threshold voltage VTH is lower (+2V) than the desired value, is set at the sub bit line precharge voltage (+5 V), when a pulse of +3 V is applied to the control gate, memory cell transistor Ma1 is turned on. As a result, a channel current flows between the drain and source of this memory cell transistor, and bit line equivalent capacitance Co is discharged, leading to a drop in drain voltage. In this state, even if a pulse of −10 V is applied to the control gate of memory cell transistor Ma1, no tunnel current flows between the floating gate and the drain. For this reason, charges are not extracted any more from the floating gate of memory cell transistor Ma1 whose initial threshold voltage VTH is low, thus preventing an over-erased state.

Assume that 10 pulses of word line drive pulse output WDPOUT are applied to a memory cell transistor, whose threshold voltage VTH (+2 V) is lower than the desired value (+2.5 V), after data "0" is written, and charges are injected into the floating gate to raise threshold voltage VTH (+6.5 V or more). In this case, threshold voltage VTH converges to the desired value (+2.5v).

As described above, in the EEPROM of the present invention, threshold voltage VTH of a memory cell transistor whose initial threshold voltage VTH is higher than the desired value is caused to converge to the desired value, and no charges are extracted from the floating gate of a memory cell transistor whose initial threshold voltage VTH is lower than the desired value.

For this reason, even if a plurality of memory cell transistors whose threshold voltages VTH vary are simultaneously erased, threshold voltages VTH of almost all the memory cell transistors can be caused to accurately converge to a desired value without over-erasing any memory cell. Therefore, "a threshold equalizing operation in a nonvolatile semiconductor memory accompanying a write operation before an erase operation", which has been performed in the prior art, need not be performed.

In the above description, write threshold Vth =2.5 V is set for word line voltage VW=3 V. However, different thresholds can also be set. For example, Vth=3.7 V for VW=3 V; Vth=3.0 V for VW=2 V; and Vth=2.3 V for VW=1 V.

Incidentally, the bit line connected to the memory cell transistor to which word line drive pulse WDPOUT is to be applied is set to a floating state (e.g., a precharged state at +5 V) before the memory cell transistor receives word line drive pulse WDPOUT. When the bit line is set to the floating state in this case, the gate threshold Vth of this memory cell transistor will be converged to a specific value (e.g., Vth=3.7 V for VW=3 V) corresponding to the one potential (e.g., +3 V) of word line drive pulse WDPOUT.

More specifically, an "automatic adjusting function of threshold voltage(s)" of memory cell transistor(s), obtained by applying a potential-varying voltage such as an AC voltage to the gate(s) of memory cell transistor(s), suggests the following. Thus, after applying the AC voltage to the gate of one or more memory cell transistors for a predetermined period of time (or by a predetermined number of cycles), the threshold voltage of each of these memory cell transistors is automatically or primarily adjusted to a prescribed value.

For obtaining a substantially-maximum advantage of the "automatic adjusting function of threshold voltage(s)" of memory cell transistor(s), it is preferable to set the bit line to the aforementioned floating state. This, however, does not mean that the present invention excludes an embodiment wherein bit line(s) is(are) not set to the floating state. For instance, the present invention can be reduced to practice wherein bit line(s) is(are) coupled, via equivalent-high-resistance element(s) or circuit(s), to a circuit with a specific voltage potential.

In order to provide the floating state (i.e., the precharged state) of bit line(s) connected to memory cell transistor(s) (Ma1, Mb1, etc.) to which word line drive pulse(s) WDPOUT is(are) applied, specific transistor(s) (Tsa1, Tsb1, etc.) connected between the sub bit line(s) and main bit line(s) may be temporarily turned off. Or, another specific transistor (Trs1, etc.) connected between the ground circuit Vss (0 V) and the common source circuit of memory cell transistors (Ma1, Mb1, etc.) may be temporarily turned off in order to obtain the above-mentioned floating state.

After the drain-side circuit (e.g., sub bit line BLsa1) of the memory cell transistor (e.g., Ma1) is precharged at, for example, +5 V, this precharged circuit is set to the floating state, or to a pseudo-floating state. Here, the term "pseudo-floating state" means that the above-mentioned floating state is substantially provided for a certain short period of time. In other words, in the pseudo-floating state, the drain-side circuit (e.g., BLsa1) of the memory cell transistor (e.g., Ma1) may be connected to a given power source circuit (e.g., the Vdd circuit with +5 V) via a high resistance (including an extremely-high resistance regarded as a substantially infinite resistance).

In the floating state, after the drain-side potential is once decreased, it will not be increased for a predetermined period of time.

On the other hand, in the pseudo-floating state, after the drain-side potential is once decreased, it could be increased by a negligible small amount for at least a short period of time.
BLsa1/BLsb1) is precharged to +5 V.

The erase, write, read, and refresh operations of the DRAM type memory shown in FIG. 1 or 3B will be summarized.
[Erase Operation]

(1) The row (gate line ST1) and column (bit line BLa1/BLb1) of a DRAM cell portion including at least one target memory cell transistor (e.g., Ma1 or Ma2, or Mb1 or Mb2) to be subjected to an erase operation are designated by row and column decoders (not shown), and a selection transistor (Tsa1/Tsb1) is turned on. With this operation, the DRAM cell portion (sub bit line BLsa1/BLsb1) is precharged to +5 V.

(2) While the drain (sub bit line BLsa1/BLsb1) of at least one target memory cell transistor (Ma1 or Ma2, or Mb1 or Mb2) is precharged to +5 V, erase word line drive pulse WDPOUT like the one shown in FIG. 2B is applied to the control gate (word line W1/W2) of at least one target memory cell transistor (Ma1 or Ma2, or Mb1 or Mb2). With this operation, the threshold of each target memory cell transistor (Ma1 or Ma2, or Mb1 or Mb2) is caused to converge to the desired value (e.g., +2.5 V) (batch erase operation of all bits; flash EEPROM operation). With this batch erase operation of all the bits, for example, data "1" (corresponding to a threshold of 2.5 V) is written in each memory cell transistor.
[Write Operation (after erase operation)]

(1) The row (gate line ST1) and column (bit line BLa1) of a DRAM cell portion (bit line equivalent capacitance Co of sub bit line BLsa1) including a target memory cell transistor (e.g., Ma1) to be subjected to a write operation are designed by row and column decoders (not shown), and a selection transistor (Tsa1) is turned on (if the power supply voltage of the memory is +5 V, for example, a voltage of +7 V is applied to the gate of selection transistor Tsa1). With this operation, bit line equivalent capacitance Co of the DRAM cell portion is charged to a write data voltage (a voltage corresponding to "1" or "0"; data "1" corresponding to, e.g., 0 V, and data "0" corresponding to, e.g., +5 V).

(2) The drain (sub bit line BLsa1) of a target memory cell transistor (Ma1) is set to a write voltage (the charge voltage of bit line equivalent capacitance Co), and a high write voltage (e.g., +6 V) is applied to the control gate (word line W1) of this memory cell transistor (Ma1), thereby injecting hot electrons corresponding to the write voltage into the floating gate of the memory cell transistor (Ma1). With this operation, information is written in the target memory cell transistor (Ma1) using the DRAM cell portion (sub bit line BLsa1) as a write buffer.

More specifically, if the write data stored in bit line equivalent capacitance Co is "0" (sub bit line BLsa1=+5 V), hot electrons are injected into the floating gate of the target memory cell transistor (Ma1) to raise its threshold to, e.g., 6.5 V or more. If the write data is "1" (sub bit line BLsa1=0 V), the threshold of the target memory cell transistor (Ma1) is kept at 2.5 V as in an erase operation without injecting any hot electrons.
[Read Operation]

(1) The row (gate line ST1) and column (bit line BLa1) of a DRAM portion (equivalent capacitance Co of sub bit line BLsa1) including a target memory transistor (e.g., Ma1) to be subjected to a read operation are designated by row and column decoders (not shown), and a selection transistor (Tsa1) is turned on. With this operation, the potential of the DRAM cell portion (sub bit line BLsa1) is precharged to a low voltage (e.g., +1 to 2 V) which does not cause injection of electrons (hot electrons) into the target memory cell transistor (Ma1). For this purpose, the potential of the column (bit line BLa1) in a read operation is set to be relatively low (e.g., +2.5 V).

(2) The potential of the control gate (word line W1) of the target memory cell transistor (Ma1) is set to an intermediate potential (about +4 V) between data "0" (a threshold of +6.5 V) and data "1" (a threshold of +2.5 V).

If the data stored in the target memory cell transistor (Ma1) is "0", since the transistor (Ma1) is kept off, the potential of the DRAM cell portion (sub bit line BLsa1) is set at the preset potential (+1 to 2 V). This potential is detected by a sense amplifier (not shown) connected to sub bit line BLsa1 and is read out as data "0".

If the data stored in the target memory cell transistor (Ma1) is "1", this transistor (Ma1) is turned on (a memory cell current flows). As a result, the potential of the DRAM cell portion (sub bit line BLsa1) drops to almost 0 V. This potential of almost 0 V is detected by a sense amplifier (not shown) connected to sub bit line BLsa1 and is read out as data "1".

[Refresh Operation]

(1) The voltage information (high/low voltage) stored in bit line equivalent capacitance Co of a DRAM cell portion (sub bit line BLsa1) is periodically read out by a sense amplifier (not shown).

(2) The sense amplifier detects the high voltage information (+5 V in a write operation; +1 to 2 V in a read operation) of sub bit line BLsa1 and, at the same time, recharges sub bit line BLsa1 with the same voltage as that detected.

In the above manner, the voltage information stored in the DRAM cell portion (sub bit line BLsa1) is refreshed in a data read operation or at a predetermined refresh period (this operation is the same as that in a known DRAM). With this operation, the information (the voltage information stored in bit line equivalent capacitance Co) in the DRAM cell portion is maintained unless the information is rewritten by an external unit or the power supply of the apparatus is turned off.

Figure 4:
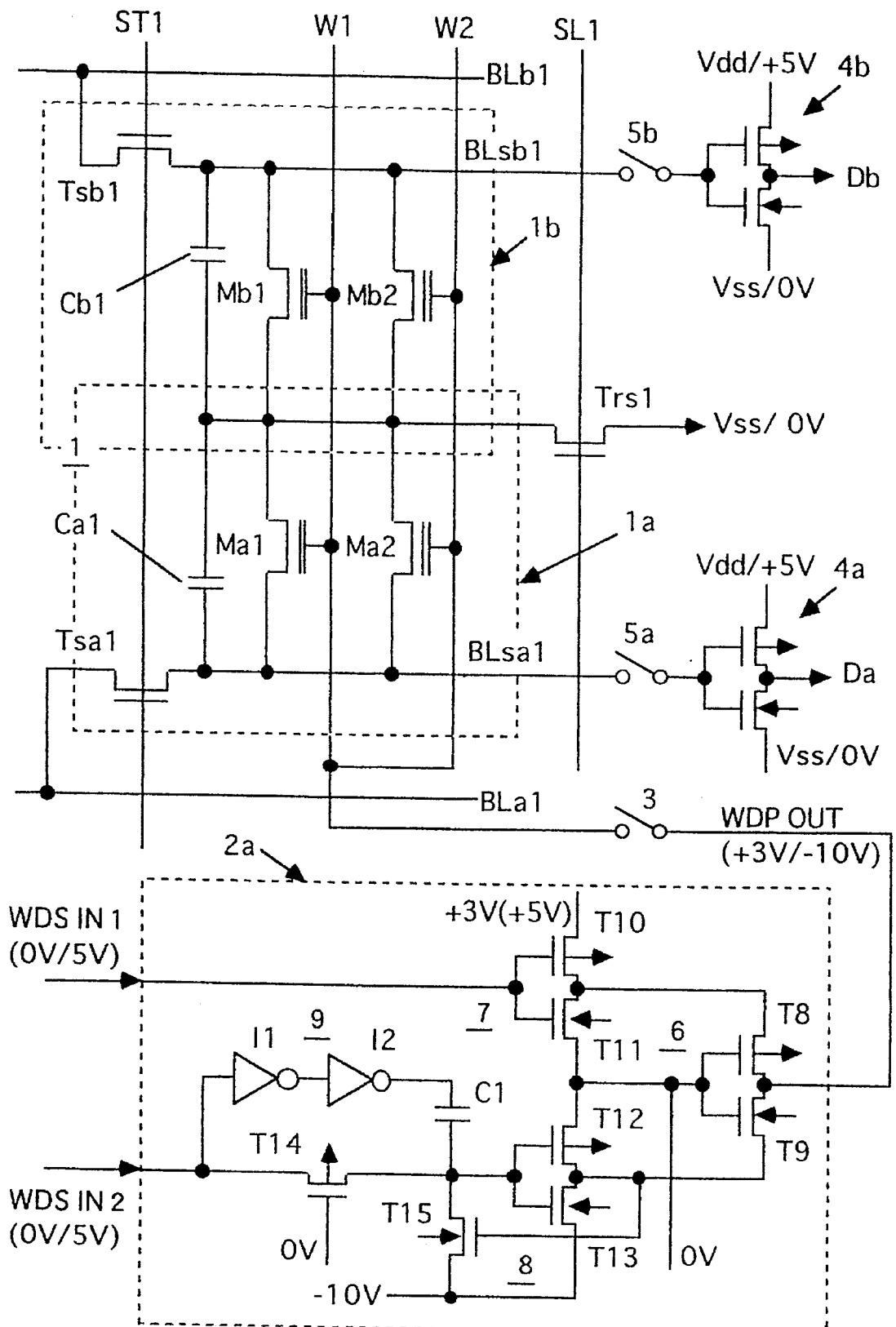
FIG. 4 is a circuit diagram for explaining the arrangement of a nonvolatile semiconductor memory according to the second embodiment of the present invention.

A nonvolatile semiconductor memory according to the second embodiment of the present invention will be described next with reference to FIG. 4. The arrangement of the embodiment shown in FIG. 4 is the same as that of the first embodiment except that a word line drive pulse generator 2a has an arrangement different from that of the word line drive pulse generator 2. For this reason, a description of identical portions will be omitted.

Word line drive pulse generator 2a comprises CMOS inverter 6 constituted by transistors T8 and T9, CMOS inverter 7 constituted by transistors T10 and T11, CMOS inverter 8 constituted by transistors T12 and T13, speed-up circuit 9 (increasing the rising/falling speed of an input pulse to CMOS inverter 8) constituted by a series circuit of inverters I1 and I2 and capacitor C1, normally ON transistor T14 (serving as a selection transistor upon control of the gate potential), and positive feedback transistor T15. The drains of transistors T11 and T12 are connected to each other and to the input terminal of CMOS inverter 6, and a voltage of 0 V is applied to the connection point thereof.

The positive power supply (the source side of p-channel MOS transistor T10) of CMOS inverter 7 is set at a voltage of +3 V (or +5 V), which corresponds to the positive pulse potential of word line drive pulse output WDPOUT. The output terminal of CMOS inverter 7 is connected to the source of p-channel MOS transistor T8.

The negative power supply (the source side of n-channel MOS transistor T13) of CMOS inverter 8 is set at a voltage of −10 V, which corresponds to the negative pulse potential of word line drive pulse output WDPOUT. The output terminal of CMOS inverter 8 is connected to the source of n-channel MOS transistor T9.

The source of n-channel MOS transistor T11 and the drain of p-channel MOS transistor T12 are connected to the input terminal of CMOS inverter 6. The output terminal of speed-up circuit 9 and the drain of n-channel MOS transistor T15 are connected to the input terminal of CMOS inverter 8, and the gate of transistor T15 is connected to the output terminal of CMOS inverter 8. The source of transistor T15 is connected to a negative power supply of −10 V.

Pulses each having a peak value of 5 V are respectively applied to the input terminals of CMOS inverters 7 and 8. A positive voltage of +3 V (or +5 V) is applied to the source of transistor T10. A negative voltage of −10 V is applied to the source of transistor T13.

When word line drive signals WDSIN1 and WDSIN2 like those shown in FIGS. 5A and 5B are input to word line drive pulse generator 2a in FIG. 4, word line drive pulse output WDPOUT like the one shown in FIG. 5C can be obtained, provided that the positive power supply voltage of CMOS inverter 7 is +3 V.

When word line drive signals WDSIN1 and WDSIN2 like those shown in FIGS. 5D and 5E are input to word line drive pulse generator 2a in FIG. 4, word line drive pulse output WDPOUT like the one shown in FIG. 5F can be obtained, provided that the positive power supply voltage of CMOS inverter 7 is +5 V.

FIGS. 5C and 5F show different waveforms of pulses WDPOUT to demonstrate variations.

If word line drive pulse output WDPOUT in FIG. 5C is applied to each of memory cell transistors Ma1 and Ma2/Mb1 and Mb2 in FIG. 4, threshold voltage VTH of each memory cell transistor can be caused to converge to a value corresponding to the voltage, +3 V, of pulse WDPOUT while electrons are extracted little by little from the floating gate of each memory cell transistor when pulse WDPOUT is set at −10 V.

If word line drive pulse output WDPOUT in FIG. 5F is applied to each of memory cell transistors Ma1 and Ma2/Mb1 and Mb2 in FIG. 4, threshold voltage VTH of each memory cell transistor can be caused to converge to a value corresponding to the voltage, +5 V, of pulse WDPOUT while electrons are extracted little by little from the floating gate of each memory cell transistor when pulse WDPOUT is set at −10 V.

The influence of large leakage of charges precharged in sub bit line BLsa1 due to leakage current component equivalent resistance Ro shown in FIG. 3B will be described next.

A leakage current in a sub bit line may be caused by an inter-drain tunnel current generated when the gate voltage of a memory cell transistor is negative, or caused by a crystal defect near a diffused drain layer. In particular, the former may be the main cause.

Assume that word line drive pulse generator 2a in FIG. 4 is operated with the waveforms shown in FIGS. 5D to 5F. In this case, FIG. 6A exemplifies voltage waveform VFG at the floating gate of a MOS transistor constituting each memory cell; FIG. 6B, voltage change VBL at a sub bit line to which the MOS transistor is connected; and FIG. 6C, voltage waveform VCG at the control gate of the MOS transistor.

Referring to FIGS. 6A to 6C, assume that curve (a) corresponds to memory cell transistor Ma1 in FIG. 4; curve (b), memory cell transistor Mb1 in FIG. 4; and curve (c), a memory cell transistor connected to the third sub bit line.

If the value of equivalent resistance Ro shown in FIG. 3B is small, i.e., a leakage current in the sub bit line is large, floating gate voltage VFG does not easily converge to a desired value. FIG. 6A shows a waveform in such a case.

More specifically, when a pulse whose peak value fluctuates from 5 V to −10 V is applied to the control gate of a nonvolatile memory cell transistor to perform an erase operation as shown in FIG. 6C, floating gate voltage VFG fluctuates in accordance with the amplitude of a pulse applied to the control gate electrode as shown in FIG. 6A. In this process, owing to the leakage current (leakage current flowing via resistance Ro) in the sub bit line, sub bit line voltages VBL to which nonvolatile memory cell transistors (a), (b), and (c) are connected abruptly drop (at different change rates), as shown in FIG. 6B. If, however, the sub bit line potential drops too quickly, the threshold voltages of nonvolatile memory cell transistors (1), (b), and (c) having different floating gate voltages VFG do not easily converge to predetermined threshold voltage VTH.

By using the embodiment shown in FIG. 3B, a drop in sub bit line voltage like the one shown in FIG. 6B can be prevented by the intermittent ON operation of bit line selection transistor Tsa1. Therefore, threshold voltage VTH (corresponding to floating gate voltage VFG) of each memory cell transistor can be reliably caused to converge to the desired value.

In the embodiment in FIGS. 3A and 3B, since the intermittent operation of the leakage current compensation circuit (Tsa1) compensates for charges escaping through leakage current component equivalent resistor Ro, the charges stored in sub bit line BLsa1 can be held for a long period of time while bit line selection transistor Tsa1 is in an OFF state. Therefore, a DRAM arrangement which allows a long refresh period can be realized by using bit line selection transistor Tsa1 as a transfer gate and equivalent capacitance Co of sub bit line BLsa1 as an information storage capacitance.

In the embodiment in FIGS. 3A and 3B, even in the presence of a leakage current, the high potential information in sub bit line BLsa1 can be kept. The low potential information in sub bit line BLsa1 can be kept by setting transistor Tsa1 in an OFF state.

Assume that the pulse in FIG. 6C is kept applied to the gate of memory cell transistor c after the threshold of the transistor converges to predetermined threshold voltage VTH (after a write operation). In this case, since transistor c is repeatedly turned on and off, a potential variation (e.g., slightly larger than the slight amplitude fluctuation of waveform c in FIG. 6B) synchronized with the pulse in FIG. 6C appears in voltage VBL of a sub bit line (BLsa1/BLsa2) (waveform b in FIG. 9B in Japanese Patent Application (Heisei) No. 6-222734 indicates a practical example of the waveform having undergone the potential variation). As will be described in detail later, this potential variation is removed by latch circuit 30 (30a, 30b) in the embodiments shown in FIGS. 10A to 10C and the subsequent drawings.

Figure 8:
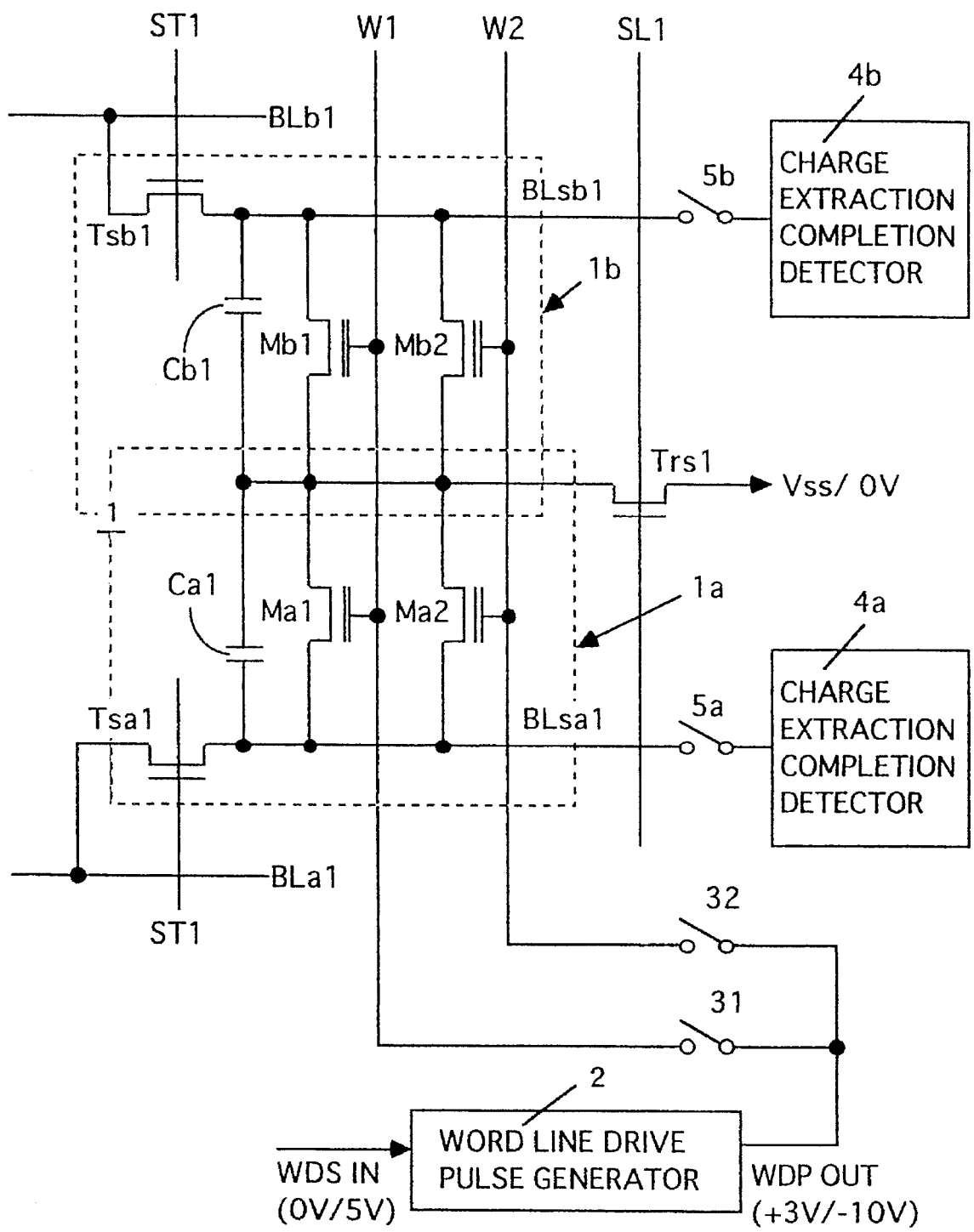
FIG. 8 is a circuit diagram for explaining the arrangement of a nonvolatile semiconductor memory according to the third embodiment of the present invention.

FIG. 8 shows the arrangement of a nonvolatile semiconductor memory according to the third embodiment of the present invention, which is also a modification of the embodiment shown in FIG. 1 or 4.

The number of word line switch circuits 3 in FIG. 1 may be set to be equal to the number of memory cell transistors Ma1 and Ma2 (Mb1 and Mb2) constituting memory cell block 1a (1b), as shown in FIG. 8. If, for example, memory cell block 1a is constituted by 1,024 memory cell transistors Ma1 to Ma1024, 1,024 word line switch circuits are prepared. Alternatively, word line switch circuit 3 may be constituted by a multiplexer for sequentially connecting the output terminal of word line drive pulse generator 2 to 1,024 word lines W1 to W1024.

Referring to FIG. 8, if all word line switch circuits 31 and 32 are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 31 and 32 are turned on each at a time to connect a specific word line to the output terminal of word line drive pulse generator 2, the data in only specific memory cell transistors in each memory cell block can be erased (an erase operation in a bit unit).

Figure 9:
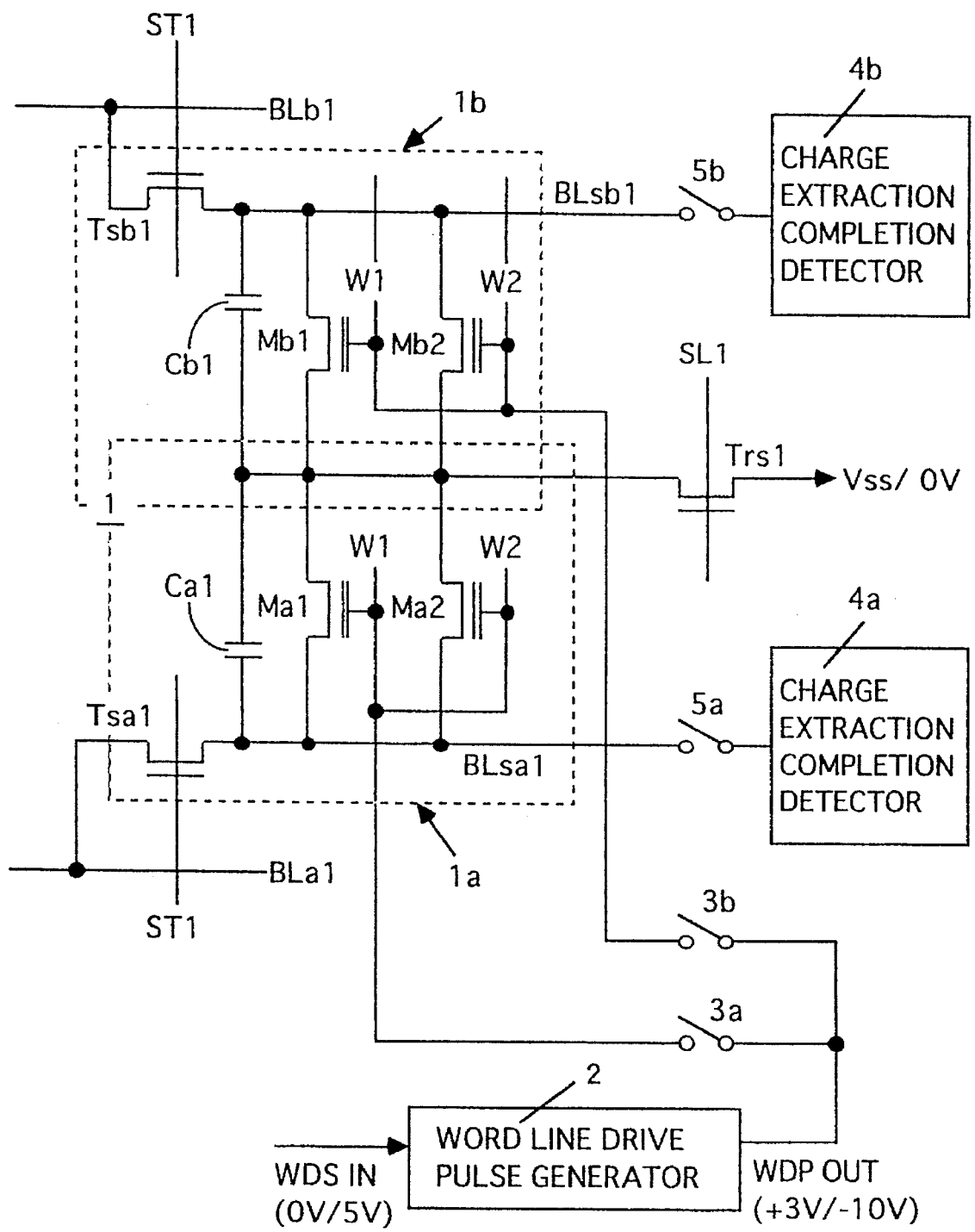
FIG. 9 is a circuit diagram for explaining the arrangement of a nonvolatile semiconductor memory according to the fourth embodiment of the present invention.

FIG. 9 shows the arrangement of a nonvolatile semiconductor memory according to the fourth embodiment of the present invention, which is also a modification of the embodiment shown in FIG. 1 or 4.

The number of word line switch circuits 3 may be set to be equal to the number of memory cell blocks 1a (1b), as shown in FIG. 9. If, for example, 512 memory cell blocks are arranged, 512 word line switch circuits are prepared. Alternatively, word line switch circuit 3 may be constituted by a multiplexer for sequentially connecting the output terminal of word line drive pulse generator 2 to 512 word lines in units of blocks.

Referring to FIG. 9, if all word line switch circuits 3a and 3b are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 3a to 3b are turned on each at a time to connect the output terminal of word line drive pulse generator 2 to each word line of a specific memory cell block, the data in all the memory cell transistors in each memory cell block can be erased in units of blocks (erase operation in units of blocks).

Figure 10A:
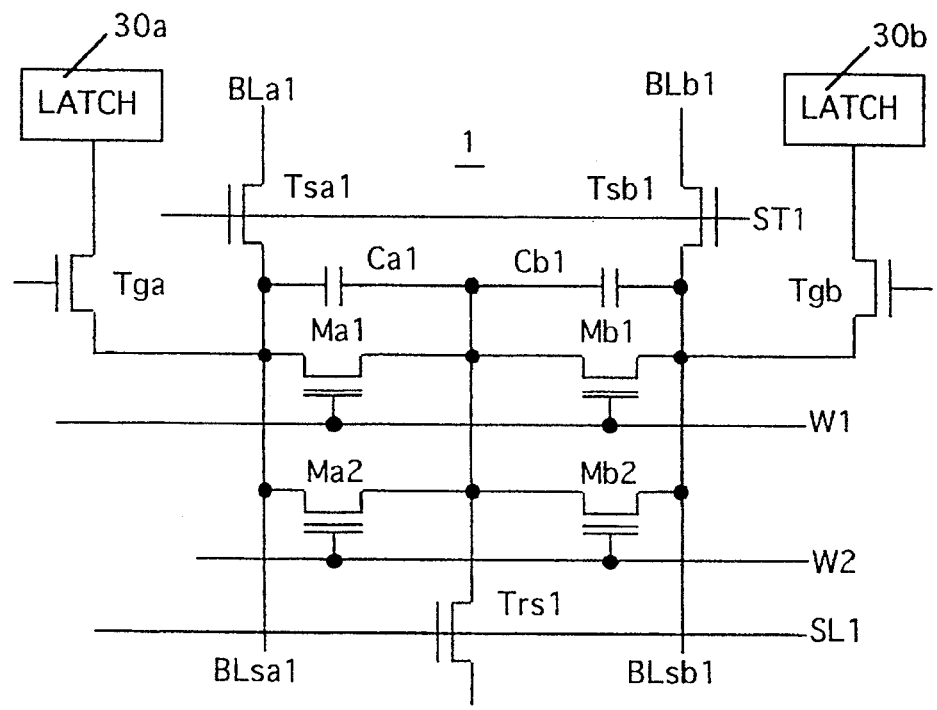
Figures 10B, 10C:
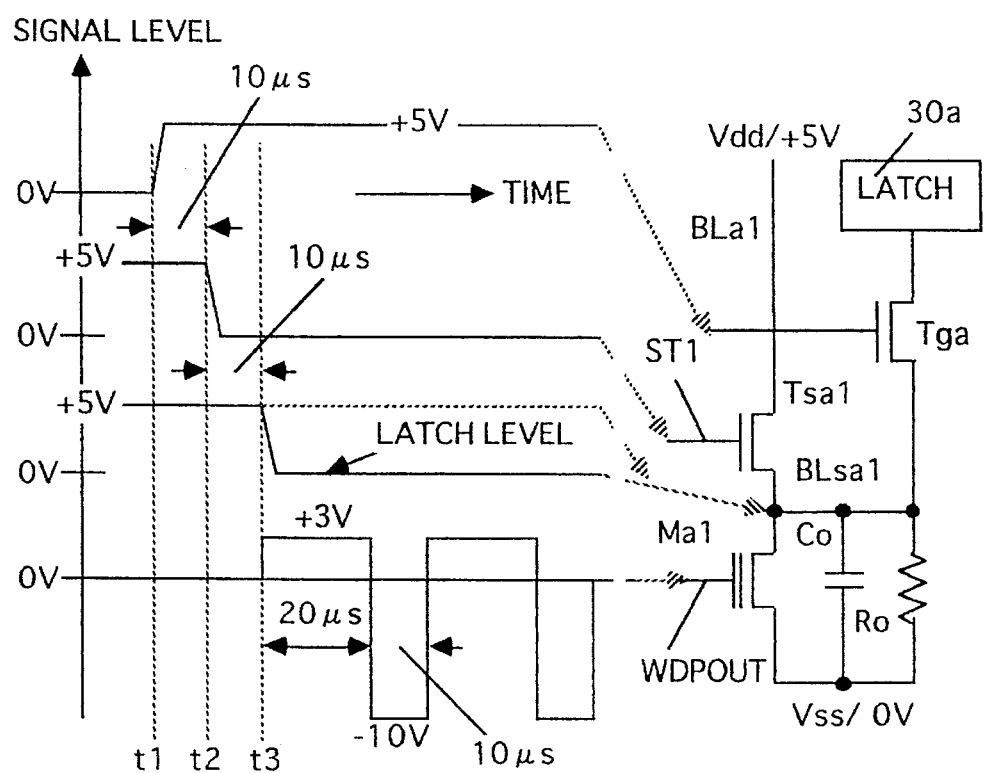

FIGS. 10A to 10C are views for explaining a nonvolatile semiconductor memory according to the fifth embodiment of the present invention. FIG. 10A is a circuit diagram showing the arrangement of the main part of the memory. FIG. 10B is a timing chart showing the waveforms of signals used in the main part. FIG. 10C is a circuit diagram showing a portion of the main part.

Referring to FIG. 10A, latch circuit 30a is connected to sub bit line BLsa1 through latch circuit connection transistor Tga, and latch circuit 30b is connected to sub bit line BLsb1 through connection transistor Tgb.

FIG. 10C shows the circuit arrangement of the main part on sub bit line BLsa1 in the circuit in FIG. 10A. More specifically, sub bit line BLsa1 is selectively connected to main bit line BLa1 through bit line selection transistor Tsa1. Memory cell transistor Ma1 is connected to sub bit line BLsa1. Capacitance Co and leakage current component resistor Ro are equivalently connected to sub bit line BLsa1. Latch circuit 30a is also connected to sub bit line BLsa1 through connection transistor Tga.

The circuit in FIG. 10C operates as follows. First of all, an address is designated to write data in memory cell transistor Ma1, and sub bit line BLsa1 is precharged to the potential (+5 V) of main bit line BLa1 (before time t1). At time t1, the signal at the haughtiest position in FIG. 10B is applied to the gate of connection transistor Tga. As a result, the drain-source path of connection transistor Tga is turned on, and latch circuit 30a is connected to sub bit line BLsa1.

Subsequently, in order to precharge sub bit line BLsa1, the level of signal ST1 (at the second height position in FIG. 10B) applied to the gate of bit line selection transistor Tsa1 is decreased to 0 V (time t2). As a result, sub bit line BLsa1 is disconnected from main bit line BLa1 and is set in a floating state in which sub bit line BLsa1 is charged to the precharge potential.

When word line drive pulse output WDPOUT (at the lowest position in FIG. 10B) is supplied to the control gate of memory cell transistor Ma1 to turn it on (time t3), the potential of sub bit line BLsa1 drops to 0 V. At this time, since latch circuit connection transistor Tga is in ON state, latch circuit 30a can detect this change in sub bit line potential.

When this change in sub bit line potential is detected, latch circuit 30a latches the sub bit line-potential (0 V) set immediately after the change in potential. As a result, the potential of sub bit line BLsa1 is clamped to the latch level (0 V) (at the third height position in FIG. 10B) of latch circuit 30a through connection transistor Tga.

As a result, variations in the potential of sub bit line BLsa1, which are synchronized with word line drive pulse output WDPOUT, almost disappear because the sub bit line potential is clamped to the latch level (0 V) even if memory cell transistor Ma1 is repeatedly tuned on and off upon continuous application (corresponding to, e.g., 10 pulses) of word line drive pulse output WDPOUT after time t3.

In this embodiment, circuit 30a is designed not to latch the precharge potential of sub bit line BLsa1 +5 V.

By connecting latch circuits 30a and 30b in FIGS. 10A to 10C to sub bit lines BLsa1 and BLsb1 in the circuit of the embodiment in FIGS. 1, 4, 8, or 9, variations in the potential of a sub bit line in each of these embodiments can be prevented.

Figure 11:
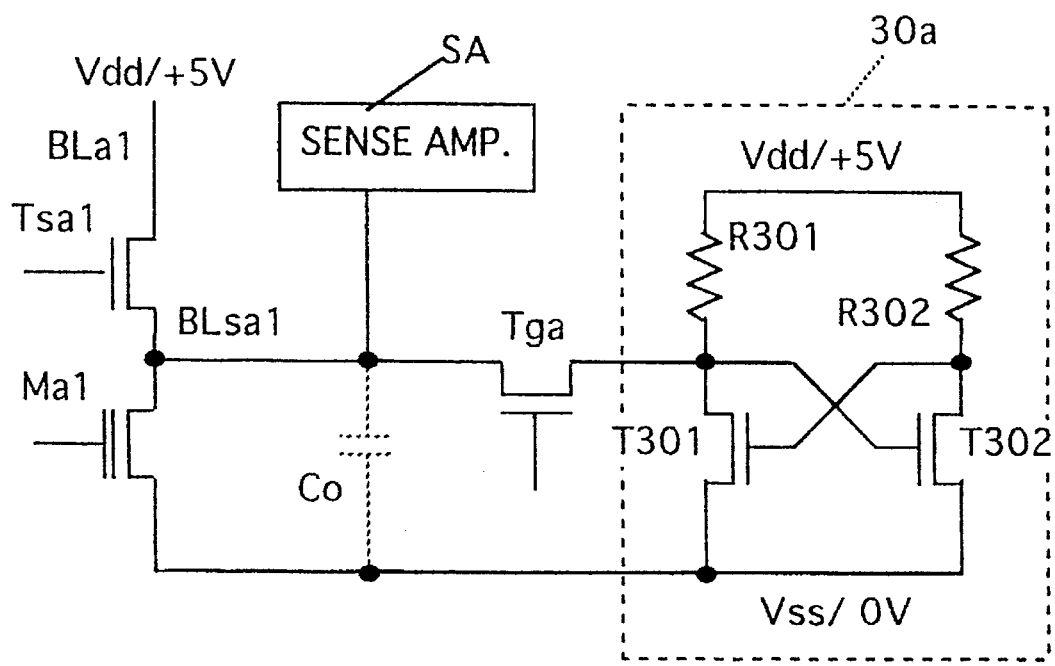
FIG. 11 is a circuit diagram showing an example of the latch circuit in the embodiment in FIGS. 10A to 10C.

FIG. 11 shows an example of latch circuit 30a in FIGS. 10A to 10C. Latch circuit 30a includes a flip-flop circuit formed by cross connection of n-channel transistor T301 having drain load resistor R301 and n-channel transistor T302 having drain load resistor R302. In a normal state, transistor T301 is in an OFF state, and transistor T302 is in an ON state.

Assume that connection transistor Tga is turned on, and sub bit line BLsa1 is connected to the gate of transistor T302. In this case, if the sub bit line potential is +5 V, transistor T302 is kept on, the circuit state of the flip-flop does not change. That is, a sub bit line potential of +5 V is not latched by latch circuit 30a.

Assume that the sub bit line potential is 0 V when connection transistor Tga is turned on, and sub bit line BLsa1 is connected to the gate of transistor T302. In this case, transistor T302 is turned off, and transistor T301 is turned on. As a result, the circuit state of the flip-flop changes, and a sub bit line potential of 0 V is latched by latch circuit 30a (the sub bit line potential is clamped to the drain potential of transistor T301 which is turned on).

The potential of sub bit line BLsa1 described above is detected by sense amplifier SA, and memory cell data corresponding to this potential is read out by sense amplifier SA.

When latch circuit connection transistor Tga is turned off, this flip-flop is restored to the initial state (transistors T301 and T302 are respectively set in an OFF state and an ON state).

Figure 12:
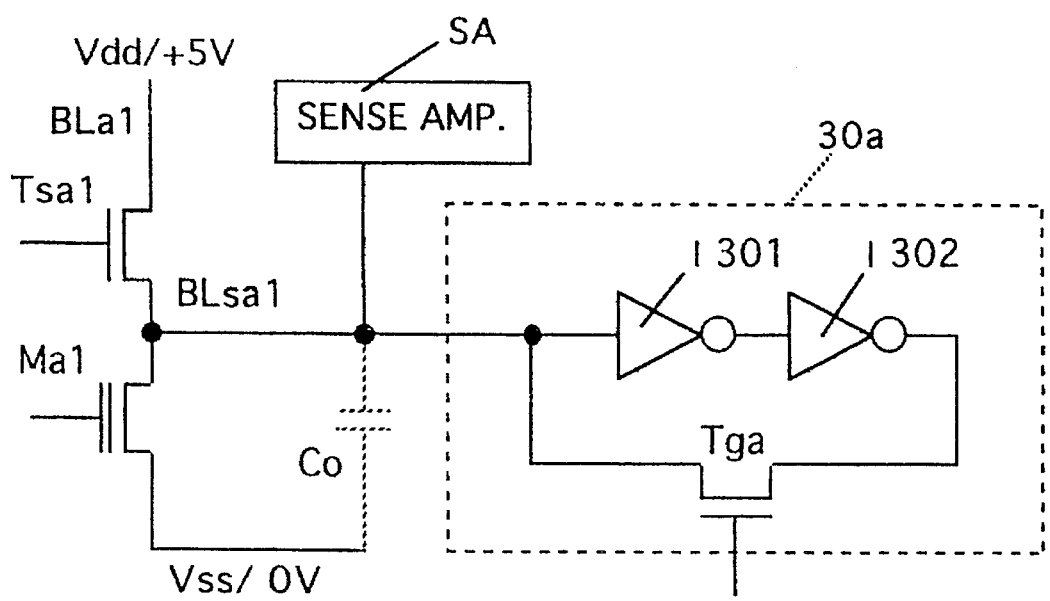
FIG. 12 is a circuit diagram showing another example of the latch circuit in the embodiment in FIGS. 10A to 10C.

FIG. 12 shows another example of latch circuit 30a in FIGS. 10A to 10C. Latch circuit 30a is constituted by two inverters I301 and I302 which are connected in series, and transistor Tga for selectively performing positive feedback of an output from inverter I302 to the input terminal of inverter I301.

In the circuit shown in FIG. 12, if the potential of sub bit line BLsa1 is +5 V when transistor Tga is turned on, the output from inverter I302 is also set at +5 V. This +5 V output is fed back to sub bit line BLsa1 through transistor Tga in an ON state, and the potential of sub bit line BLsa1 is clamped (latched) to +5 V.

If the potential of sub bit line BLsa1 is 0 V when transistor Tga is turned on, the output from inverter I302 is also set at 0 V. This 0 V output is fed back to sub bit line BLsa1 through transistor Tga in an ON state, and the potential of sub bit line BLsa1 is clamped (latched) to 0 V. With this clamping to 0 V, variations in the potential of sub bit line BLsa1 are suppressed.

In the above embodiments (shown in FIG. 1, for example), charge extraction completion detectors (4a and 4b) are respectively arranged for sub bit lines (BLsa1 and BLsb1). These charge extraction completion detectors may be respectively connected to the corresponding main bit lines (BLa1 and BLb1). In this case, control must be performed to turn on bit line selection transistors (Tsa1 and Tsb1) in detecting the completion of charge extraction. In general, however, since the number of main bit lines is much smaller than that of sub bit lines, if charge extraction completion detectors (4a and 4b) are arranged on the main bit line side, the number of charge extraction completion detectors (4a and 4b) required can be greatly decreased.

The nonvolatile semiconductor memory of the present invention is not limited to a memory cell array arrangement like the one shown in FIG. 1. The present invention can be applied to various types of memory cell arrays, e.g., an array having memory cell blocks, each constituted by many (several hundreds) memory cell transistors, which are respectively connected to many main bit lines.

As described above, according to the nonvolatile semiconductor memory of the present invention, the different floating gate voltages of many memory cell transistors can be caused to converge to a predetermined potential by applying a pulse oscillating between positive and negative voltages to the floating gate of at least one address-designated target memory cell transistor after the sub bit line is precharged. With a very simple operation, therefore, data can be accurately written/erased in/from many volatile memory cells. In this case, since the potential of a sub bit line is latched by a latch circuit, this sub bit line potential is fixed to the latched potential to become free from variations in potential.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A memory device comprising:

a memory cell array having a plurality of word lines, a plurality of bit lines, and memory cells each arranged at an intersection between each word line and each bit line;

a memory cell transistor having a floating gate for holding nonvolatile information, and a control gate, connected to the word line, for controlling writing, erasing, or reading of information held in the floating gate, said memory cell transistor constituting said memory cell;

means for latching potential of said bit line which is determined in correspondence with data stored in said memory cell transistor; and drive signal means for supplying a drive signal to the control gate of said memory cell transistor, the drive signal alternately and repeatedly having a first potential and a second potential different from the first potential.

2. The memory device of claim 1, further comprising:

supply means for supplying a current to said bit line at a predetermined timing in accordance with the potential latched by said latch means.

3. The memory device of claim 1, wherein said latch means includes a 1-bit memory for storing binary information corresponding to the potential of said bit line.

4. The memory device of claim 2, wherein said latch means includes a memory for storing information corresponding to the current supplied to said bit line.

5. The memory device of claim 1, further comprising:

supply means for supplying a current to said bit line at a predetermined timing in accordance with the potential latched by said latch means.

6. The memory device of claim 1, wherein said latch means includes a 1-bit memory for storing binary information corresponding to the potential of said bit line.

7. The memory device of claim 5, wherein said latch means includes a memory for storing information corresponding to the current supplied to said bit line.

8. A nonvolatile semiconductor memory comprising:

main bit line;

sub bit line;

a bit line selection transistor for selectively connecting said sub bit line to said main bit line;

a memory cell transistor having a floating gate for holding nonvolatile information, and a control gate for controlling writing, erasing, or reading of information held in the floating gate, said memory cell transistor being connected to said sub bit drive signal means for supplying a drive signal to the control gate of said memory cell transistor, the drive signal alternately and repeatedly having a first potential and a second potential different from the first potential; and means for latching a potential of said sub bit line which is determined in correspondence with data stored in said memory cell transistor, when said sub bit line selection transistor disconnects said bit line from said main bit line.

9. A nonvolatile semiconductor memory comprising:

a main bit line;

a sub bit line;

a bit line selection transistor for selectively connecting said sub bit line to said main bit line;

a memory cell transistor having a floating gate for holding nonvolatile information, and a control gate for controlling writing, erasing, or reading of information held in the floating gate, said memory cell transistor being connected to said sub bit line;

drive signal means for supplying a drive signal to the control gate of said memory cell transistor, the drive signal alternately and repeatedly having a first potential and a second potential different from the first potential; and means for latching a potential of said sub bit line which is set after predetermined information is written in said memory cell transistor, while said bit line selection transistor keeps disconnecting said sub bit line from said main bit line.

10. The memory according to claim 1, further comprising said memory cell transistor having a source and a drain, and means for setting either one of the source and drain of said memory cell transistor in a floating state higher in potential than the other before applying said drive signal to the control gate of said memory cell transistor.

11. The memory according to claim 8, further comprising said memory cell transistor having a source and a drain, and means for setting either one of the source and drain of said memory cell transistor in a floating state higher in potential than the other before applying said drive signal to the control gate of said memory cell transistor.

12. The memory according to claim 9, further comprising said memory cell transistor having a source and a drain, and means for setting either one of the source and drain of said memory cell transistor in a floating state higher in potential than the other before applying said drive signal to the control gate of said memory cell transistor.

13. The memory according to claim 10 wherein one of the source and drain of said memory cell transistor, being set to the floating state, is coupled to one of said bit lines which is also set at the floating state.

14. The memory according to claim 11 wherein one of the source and drain of said memory cell transistor, being set to the floating state, is coupled to said sub bit line which is also set at the floating state.

15. The memory according to claim 12 wherein one of the source and drain of said memory cell transistor, being set to the floating state, is couple to said sub bit line which is also set at the floating state.

* * * * *